US009806286B2

(12) United States Patent
Fujiyoshi et al.

(10) Patent No.: US 9,806,286 B2
(45) Date of Patent: Oct. 31, 2017

(54) DISPLAY DEVICE AND METHOD OF MANUFACTURING THE SAME

(71) Applicant: Japan Display Inc., Tokyo (JP)

(72) Inventors: Jun Fujiyoshi, Tokyo (JP); Kazuto Tsuruoka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/742,259

(22) Filed: Jun. 17, 2015

(65) Prior Publication Data
US 2015/0380679 A1    Dec. 31, 2015

(30) Foreign Application Priority Data

Jun. 25, 2014    (JP) .................................. 2014-130279

(51) Int. Cl.
*H01L 51/52*    (2006.01)
*H01L 51/00*    (2006.01)
*H01L 27/32*    (2006.01)

(52) U.S. Cl.
CPC ...... *H01L 51/5253* (2013.01); *H01L 27/3276* (2013.01); *H01L 51/0097* (2013.01); *H01L 51/524* (2013.01); *H01L 2251/5338* (2013.01); *Y02E 10/549* (2013.01); *Y02P 70/521* (2015.11)

(58) Field of Classification Search
CPC combination set(s) only.
See application file for complete search history.

(56) References Cited

U.S. PATENT DOCUMENTS

| 2007/0152577 | A1  | 7/2007 | Cho et al. |
| 2008/0111492 | A1  | 5/2008 | Kwak et al. |
| 2011/0050657 | A1* | 3/2011 | Yamada .............. H01L 27/3293 345/204 |

(Continued)

FOREIGN PATENT DOCUMENTS

| JP | 2001-331122 A | 11/2001 |
| JP | 2007-183605 A | 7/2007 |

(Continued)

OTHER PUBLICATIONS

Korean Office Action dated Sep. 22, 2016 for corresponding Korean Application No. 10-2015-0081374 with partial translation.

(Continued)

*Primary Examiner* — Lawrence-Linh T Nguyen
(74) *Attorney, Agent, or Firm* — Typha IP LLC

(57) ABSTRACT

The aim is to improve the bending resistance a display device. The display device in one embodiment includes a substrate including a first surface and a second surface and a curved part between the first surface and the second surface, a display element arranged on the first surface, a conducting layer connected with the display element and extending to the second surface from the first surface via the curved part, a plurality of protective layers having a lower ductility than the substrate and arranged in the substrate side and/or opposite side to the substrate side with respect to the conducting layer and along the curved part, wherein each of the plurality of protective layers spreading over the curved part, to a certain region of the first surface side from the curved part, and to a certain region of the second side from the curved part.

17 Claims, 16 Drawing Sheets

(56) References Cited

U.S. PATENT DOCUMENTS

2012/0062447 A1* 3/2012 Tseng ................ G02F 1/133305
                                                    345/33
2012/0218219 A1* 8/2012 Rappoport .......... H01L 27/3276
                                                    345/174
2014/0097408 A1    4/2014 Kim et al.

FOREIGN PATENT DOCUMENTS

| KR | 10-0812001 B1 | 3/2008 |
| KR | 10-2010-0005644 A | 1/2010 |
| KR | 10-2014-0045193 A | 4/2014 |

OTHER PUBLICATIONS

Korean Office Action dated Mar. 28, 2017 for corresponding KR patent application No. 10-2015-0081374, with partial English translation.

* cited by examiner

DISPLAY DEVICE AND METHOD OF MANUFACTURING THE SAME

CROSS-REFERENCE TO RELATED APPLICATIONS

This application is based upon and claims the benefit of priority from the prior Japanese Patent Application No. 2014-130279, filed on Jun. 25, 2014, the entire contents of which are incorporated herein by reference.

FIELD

The present invention is related to a display device and a method of manufacturing the display device.

BACKGROUND

A display device which uses liquid crystals or OLED (Organic Light Emitting Diode) is conventionally manufactured by forming a display element above a glass substrate. In recent years, display devices are being developed which can curve by forming the display element above a substrate having flexibility (for example, Japanese Laid Open Patent 2007-183605).

The radius of curvature when curving a substrate having flexibility becomes smaller the greater the load on a layer formed above the substrate. The load often leads to defects such as breakage. In particular, operational defects occur when a conducting layer breaks. However, from the view point of design and convenience, it is desired that the radius of curvature be reduced as much as possible, that is, bending resistance be improved.

The present invention aims to improve the bending resistance of a display device.

SUMMARY

One embodiment provides a display device including a substrate including a first surface and a second surface and a curved part between the first surface and the second surface, a display element arranged on the first surface, a conducting layer connected with the display element and extending to the second surface from the first surface via the curved part, a plurality of protective layers having lower ductility than the substrate and arranged in the substrate side and/or opposite side to the substrate side with respect to the conducting layer and along the curved part, each of the plurality of protective layers spreading over the curved part, to a certain region of the first surface side from the curved part, and to a certain region of the second side from the curved part.

In addition, one embodiment provides a method of manufacturing a display device including forming a display element, conducting layer and a plurality of protective layers in a substrate including a first surface, a second surface and a curved planned region between the first surface and second surface respectively, the display element being formed in at least the first surface, the conducting layer connecting with the display element and extending to the second surface via the curved planned region from the first surface, each of the plurality of protective layers having lower ductility than the substrate, being arranged in the substrate side and/or opposite side to the substrate side with respect to the conducting layer, the protective layer spreading over the curved planned region, to a certain region of the first surface side from the curved planned region, and to a certain region of the second side from the curved planned region, and each of the plurality of the protective layers being arranged along the curved planned region, curving and fixing the substrate in the curved planned region, and baking the substrate.

In addition, one embodiment provides a display device including a substrate, a display element arranged in the substrate, a conducting layer connected with the display element and extending in a certain direction, and a plurality of protective layers having lower ductility than the substrate and arranged above a line along a direction different to a direction in which the conductive layer extends in the substrate side and/or opposite side to the substrate side with respect to the conducting layer.

DESCRIPTION OF EMBODIMENTS

Each embodiment of the present invention is explained below while referring to the diagrams. Furthermore, the disclosure is merely an example and appropriate modifications could be conceived while maintaining the scope of the invention which are also included in the scope of the present invention. In addition, in order to better clarify the invention, the width and shape etc of each part in drawings are sometimes shown schematically compared to the actual forms and should not be interpreted as limiting the present invention. In addition, in the specification and each drawing, the same reference symbols are attached to similar elements which have previously been described and a detailed explanation of these elements may be omitted where appropriate.

First Embodiment

[Outline Structure]

The display device in one embodiment of the present invention is an organic EL (Electro-luminescence) display device which uses an OLED. This display device includes flexibility. Furthermore, the display device in the present embodiment is not limited to a self-emitting type display device such as an organic EL display device and may be a liquid crystal display device using liquid crystals, an electronic paper type display device which uses an electrophoretic element or any other display device.

The display device uses an organic resin film which includes flexibility in a substrate. A display element for displaying an image is formed above the substrate including flexibility (sometimes referred to below as flexible substrate). A drive element such as a thin film transistor (TFT) for controlling the light emitting state of an OLED is included in the display element. The flexible substrate is supported by a glass substrate when forming a thin film transistor and is peeled from the glass substrate in the manufacturing process of the display device.

[External Appearance of a Display Device 1]

Figure 1A:
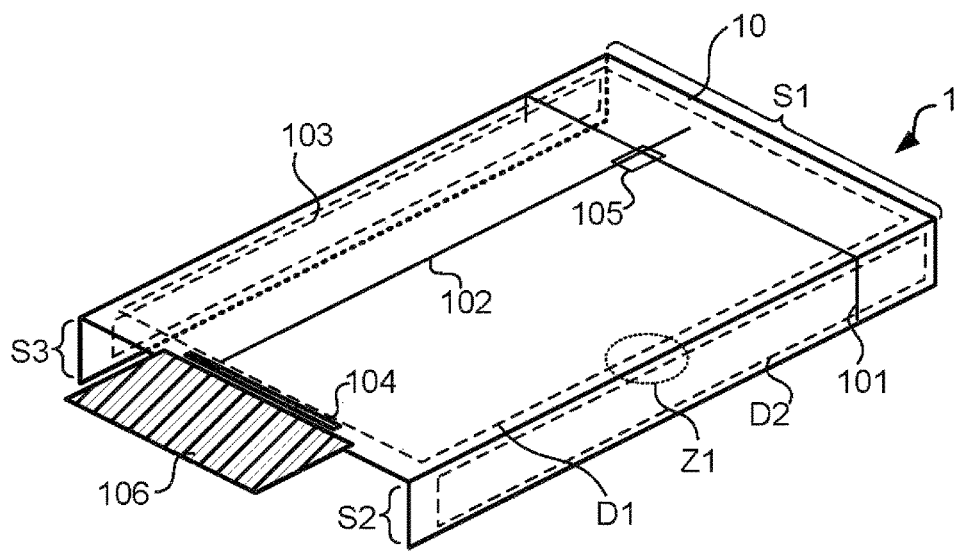
FIG. 1A~FIG. 1B is a planar view showing an outline structure of a display device in a first embodiment.
Figure 1B:
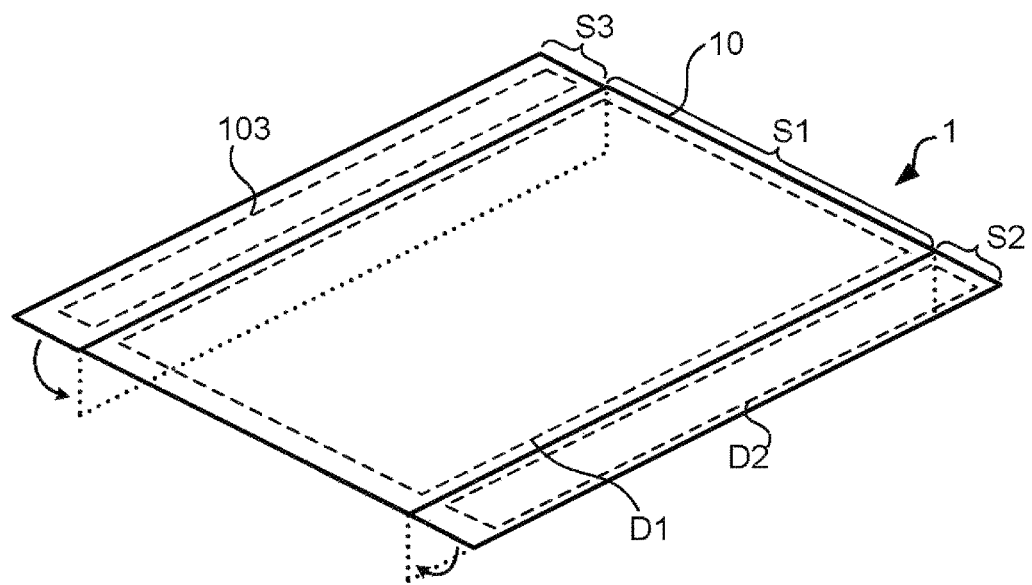

FIG. 1A~1B are planar diagrams showing a schematic structure of a display device 1 in one embodiment. As is shown in FIG. 1A, the display device 1 is arranged with a display region D1, D2, a scanning line drive circuit 103, a driver IC 104 and a FPC (Flexible Printed Circuit) 106. These are formed in a flexible substrate 10.

The flexible substrate 10 includes a first surface S1 including the first display region D1, a second surface S2 including the display region D2, and a third surface S3 including the scanning line drive circuit 103. A display element is formed in the display regions D1, D2. In this way, the display regions D1 and D2 can display an image. The first surface S1 and second surface S2 are curved so that angle of approximately 90 degrees is formed. A bent region, that is, a region between the first surface S1 and second surface S2 is referred to as curved part C (see FIG. 2 for example). The relationship between the first surface S1 and third surface S3 is the same as the relationship between the first surface S1 and second surface S2 in that they curve so as to form an angle of approximately 90 degrees. Furthermore, the curved angle is not limited to 90 degrees and may be 90 degrees or less and 90 degree or more.

When a part of a surface curves in this way, for example it is possible to arrange a display region as large as possible on the largest surface in a mobile terminal (smartphone etc) having a roughly rectangular case and form a drive circuit on a side surface. In addition, it is possible to arrange a display on a side surface. In addition, it is possible to adjust the curved angle of each surface of the display device 1 to the shape of a casing other than a rectangle and arrange a display region and drive circuit etc.

Furthermore, it is not necessary for a display region to exist on the second surface 2 and in this case a drive circuit of a circuit included in the display region 1 or a device such as a sensor which receives inputs from a user may be arranged. In addition, a display region may also be arranged on the third surface S3. As is shown in FIG. 1A, the present invention is not limited to three surfaces, two surfaces or more than three surfaces may be included.

A case having a fourth surface is exemplified as a case where more surfaces are included. For example, a fourth surface S4 may be arranged in an end part (edge facing an edge of the first surface S1 side) of the second surface S2. The fourth surface S4 may be formed on another edge side of the second surface S2 or formed on an edge side opposite the FPC 106 of the first surface S1.

Scanning line 101 which extends to the second surface S2 via the first surface S1 from the third surface S3 and data signal line 102 which crosses perpendicularly with the scanning line 101 are arranged in the display region D1. A pixel 105 is arranged in a position corresponding to an intersection point between the scanning line 101 and the data signal line 102. The pixel 105 is arranged in a matrix shape. Furthermore, although one signal line extending in a direction along the scanning line 101 or data signal line 102 per pixel 105 is shown in FIG. 1A, a plurality of signal lines may also be arranged. In addition, wiring which supplies a certain voltage such as a power source line may be arranged in the display region D1.

Although a description is omitted in FIG. 1A, a pixel 105 may also be arranged in the display region D2 the same as the display region D1.

The scanning line drive circuit 103 supplies a control signal to a scanning line 101. The driver IC 104 supplies a data voltage to a data signal line 102 and controls the scanning drive circuit 104. A display element including for controlling emitted light based on a control signal and a data voltage, and a light emitting element (OLED) which is controlled by the pixel circuit are arranged in each pixel 105. The pixel circuit includes a thin film transistor and capacitor for example, the thin film transistor is driven by a control signal and data voltage and controls the emitted light of a light emitting element. An image is displayed in the display regions D1, D2 by control of the emitted light.

In addition, an opposing substrate 20 (see FIG. 5 for example) is bonded to the flexible substrate 10 so as to cover a pixel circuit of each pixel 105. The opposing substrate 20 is an organic resin layer having flexibility. A color filter and light blocking material and the like may also be formed on the opposing substrate 20. In this example, a filler is filled between the flexible substrate 10 and opposing substrate 20.

FIG. 1B shows a state before the second surface S2 and third surface S3 are curved. Each manufacturing process is performed in at least the stated shown in FIG. 1B until a display element is formed in the flexible substrate 10 and the opposing substrate 20 is bonded. Following this, the second surface S2 and third surface S3 are curved with respect to the first surface S1 respectively.

In this example, the second surface S2 and third surface S3 are curved with respect to the first surface and baked in a state fixed to a metal mold or the like. The driver IC 104 and FPC 106 may be attached to the display device 1 shown in FIG. 1A or attached to the display device 1 shown in FIG. 1B.

Figure 2:
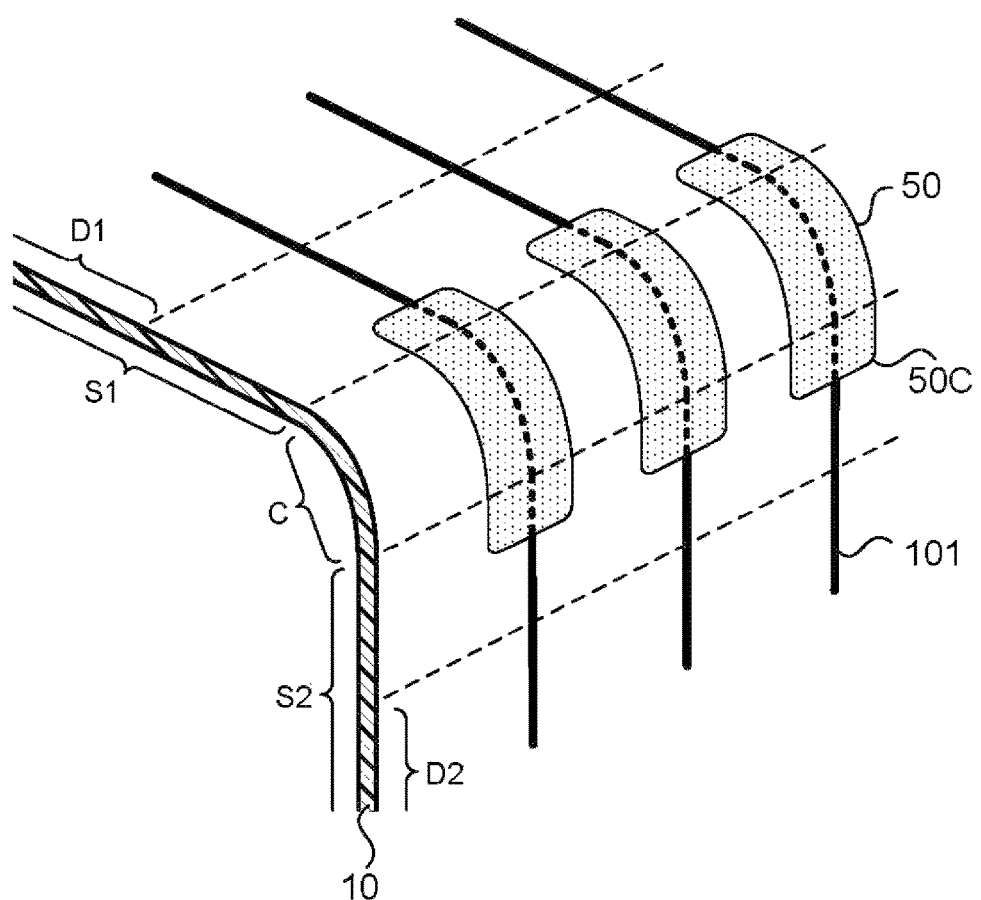
FIG. 2 is a diagram for explaining a protective layer arranged in a curved part in the first embodiment.

Next, a region Z1 shown in FIG. 1A, that is, a curved part between the first surface S1 and second surface S2 is explained using FIG. 2.

[Structure of a Protection Layer 50]

FIG. 2 is a diagram for explaining a protection layer 50 arranged in a curved part C in the first embodiment. In the explanation below, a region in which the flexible substrate 10 is curved between the first surface S1 and second surface S2 is referred to as curved part C. A scanning line 101 which is a conducting layer extends to the second surface S2 from the first surface S1 via the curved part C. The scanning line 101 is connected with a display element of the display region D1 and a display element of the display region D2.

In this example, the protection layer 50 is arranged so as to cover the scanning line 101. The protection layer 50 is formed using a material with lower ductility than the flexible substrate 10. For example, in the case where the flexible substrate 10 is formed using polyimide, the protection layer 50 is formed using an acrylic resin.

The protection layer 50 covers the scanning line 101 in a certain area of the curved part C and the first surface S1 side from the curved part C, and a certain area of the second surface S2 side from the curved part C. The certain area of the first surface S1 is an area different to the display region D1 and is determined so as not to overlap the display region D1. Similarly, the certain area of the second surface S2 is an area different to the display region D1 and is determined so as not to overlap the display region D2.

In the example in FIG. 2, one protection layer 50 is formed with respect to one scanning line 101. In this way, the protection layer 50 is formed in an island shape and is arranged along the curved part C (along the boundary between the first surface S1 and second surface S2 in the case shown in FIG. 1A). Furthermore, the protection layer 50 may be formed in an island shape and one protection layer 50 may be formed with respect to a plurality of scanning lines 101. As described above, the protection layer is formed using a material with lower ductility than the flexible substrate 10. In order to easily curve the flexible substrate 10 in the curved part C, it is preferred to reduce the area occupied by the protection layer 50 which is a material with low ductility in the cured part C. Therefore, while the protection layer 50 is arranged so as to cover the scanning line 101 in the curved part C, it is preferred that a region in which the protection layer 50 does not exists is arranged between adjacent scanning lines 101.

In addition, it is possible to suppress peeling of the protection layer 50 from the flexible substrate 10 by spreading the protection layer 50 up to the first surface S1 and second surface S2 from the curved part C. On the other hand, when the protection layer 50 is spread widely in the first surface S1 and second surface S2, the effects of stress produced in the curved part C are transmitted to other regions (for example, display regions D1 and D2). Therefore, it is preferred that the protection in the first surface S1 and second surface S2 does not spread as far as the display regions D1, D2.

In addition, it order to suppress peeling of the protection layer 50 from the flexible substrate 10, it is preferred that a pattern periphery edge part of the protection layer 50 does not include an angle. Therefore, as is shown in FIG. 2, it is preferred that the four corner 50C of a pattern are formed into curved lines and the pattern periphery edge part of the protection layer 50 is formed into a pattern which is enclosed by lines which do not have a vertex.

Figure 3:
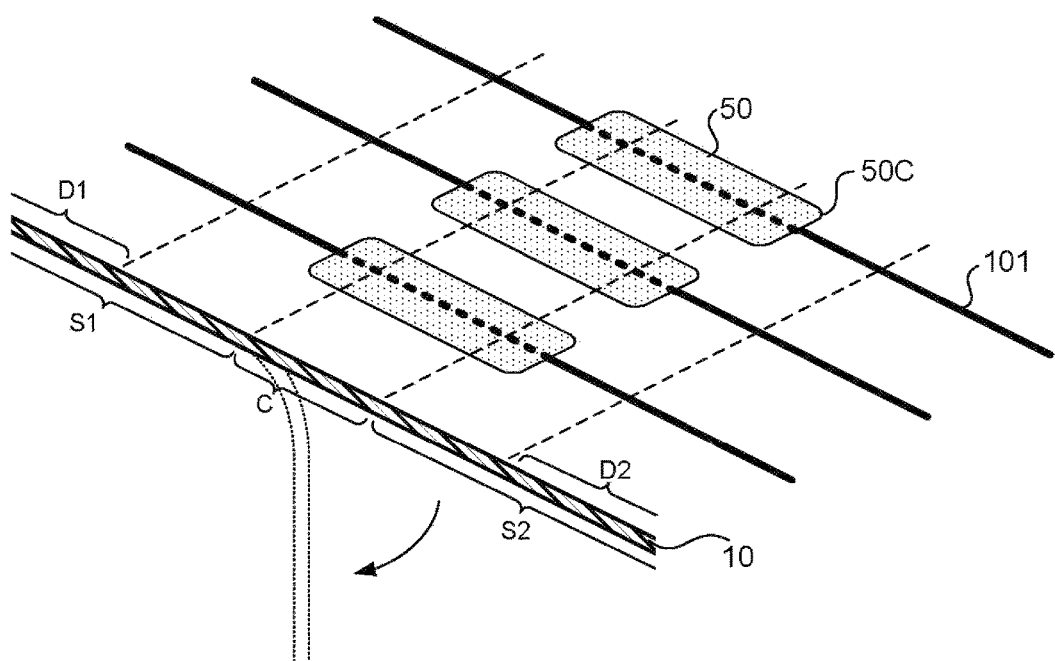
FIG. 3 is a diagram for explaining a protective layer arranged in a curved part in the first embodiment.

FIG. 3 is a diagram for explaining the protection layer 50 in a curved part in the first embodiment. FIG. 3 shows the protection layer 50 in a state before the second surface S2 and third surface S3 shown in FIG. 1B are curved. As is shown in FIG. 3, in the case where the first surface S1 and second surface S2 are positioned on the same planar surface, the curved part C is the region intended to be curved (referred to below as curved planned region). The scanning line 101 extends across the curved planned region. In addition, the protection layer 50 is formed in a straight line in a different direction to the direction in which the scanning line 101 extends. The curved planned region spreads along the straight line.

The substrate changes into the shape shown in FIG. 2 when the flexible substrate 10 is curved in the direction of the arrow in FIG. 3. At this time, a force is applied in to the scanning line in a pulling direction (direction in which it is easily broken). On the other hand, by providing the protection layer 50 which has lower ductility than the flexible substrate 10 in the curved part C, the protection layer 50 produces a force in a direction which compresses the flexible substrate 10. Therefore, it is possible to relieve the force whereby the flexible substrate 10 pulls the scanning line 101.

When the flexible substrate 10 is baked in a curved state, the stress applied to an organic resin such as the flexible substrate 10 and protection layer 50 is relieved. In this way, the shape of the flexible substrate 10 can be easily maintained in a curved state.

Figure 4:
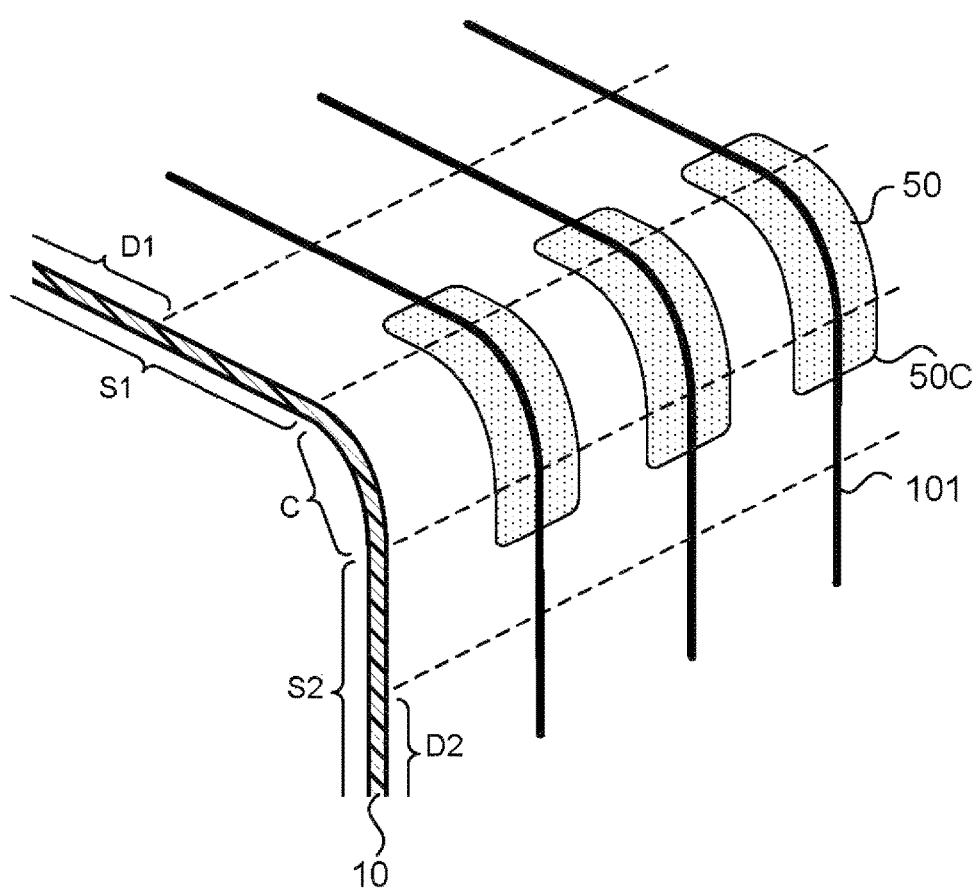
FIG. 4 is a diagram for explaining another example of a protective layer arranged in a curved part in the first embodiment.

FIG. 4 is a diagram for explaining another example of a protection layer arranged in a curved part C in the first embodiment. In the example described above, the protection layer 50 covers the scanning line 101, that is, the protection layer 50 is arranged further to the opposite side (referred to simply as upper layer side below) of the flexible substrate 10 than the scanning line 101. On the other hand, reversely, the protection layer 50 may be arranged further to the flexible substrate 10 side (referred to simply as lower layer side below) than the scanning layer 101. Even in this case, the protection layer 50 adds a force in the direction where the flexible substrate 10 is compressed. Therefore, it is possible for the flexible substrate 10 to relieve the force which pulls the scanning line 101.

Furthermore, by combining FIG. 2 and FIG. 4, the protection layer 50 may be arranged on both sides (upper layer side and lower layer side) of the scanning line 101. The positional relationship between the protection layer 50 and scanning line 101 is described in detail below.

[Cross-Sectional Structure of the Display Device 1]

Figure 5:
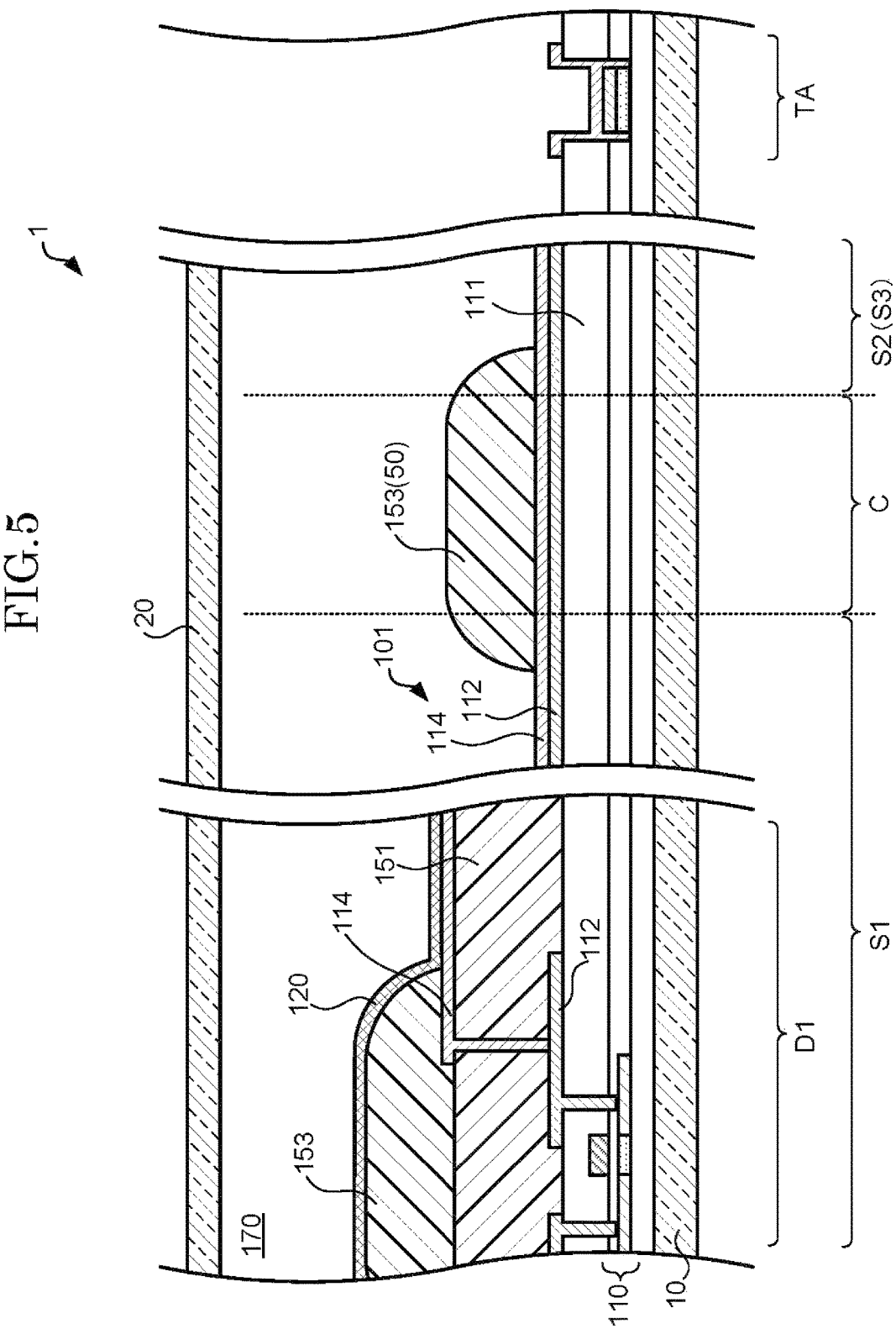
FIG. 5 is a schematic diagram showing a cross-structure of a display device in the first embodiment.

FIG. 5 is a schematic diagram showing a cross-sectional structure of a display device in the first embodiment. In FIG. 5 and FIG. 6 to FIG. 12 described below, D1, D2, S1, S2, S3 and C correspond to the display region D1, first surface S1, second surface S2, third surface S3 and curved part C described above. In addition, TA refers to a region arranged with terminal connected to the exterior parts such as FPC 106 and the like.

A thin film transistor 110 is arranged in the flexible substrate 10. An interlayer insulation layer 111 is arranged so as to cover the thin film transistor 110. A wiring layer 112 is arranged above the interlayer insulation layer 111. The wiring layer 112 is connected to the thin film transistor 110 via a contact hole arranged in the interlayer insulation layer 111.

An interlayer organic layer 151 is arranged to cover a wiring layer 112 in the display region D1 and a pixel electrode layer 114 is arranged above the interlayer organic layer 151. The pixel electrode layer 114 is connected to the wiring layer 12 via a contact hole arranged in the interlayer organic layer 151. A rib organic layer 153 is arranged to expose a part of the pixel electrode layer 114 and cover an end part of the pixel electrode layer 114. A light emitting layer 120 is arranged to be connected with the exposed pixel electrode layer 114.

The light emitting layer 120 includes an OLED, a translucent electrode which allows light to pass through from the OLED, and a sealing layer which seals the OLED and translucent electrode. In this example, when a current is supplied to the OLED via the translucent electrode and pixel electrode layer 114, light from the OLED passes through the translucent electrode and is emitted to the opposing substrate 20 side. This structure is generally called a top emission type structure. Furthermore, the reverse of the top emission type structure may be adopted in which light is emitted to the flexible substrate 10 side called a bottom emission type structure.

These structures which exist in the display region D1 correspond to a display element.

The interlayer organic layer 151 is removed in the vicinity of the curved part C and the wiring layer 112 and pixel electrode layer 114 are stacked. In this example, the scanning line 101 is formed using the stacked structure of the wiring layer 112 and pixel electrode layer 114. The rib organic layer 153 corresponding to the protection layer 50 described above is formed above the pixel electrode layer 114 in the curved part C and a certain region of the first surface S1 side from the curved part C, and a certain region of the second side surface S2 from the curved part C.

In a region which includes at least the display regions D1, D2 except the terminal region TA in FIG. 5 (in this example, a region which further includes the vicinity of the curved part C), each structure which exists in each region is covered by the opposing substrate 20. A filler 170 is filled between each structure formed on the opposing substrate 20 and flexible substrate 10 side. Furthermore, a sealing material may be arranged so as to enclose the filler 170 along the periphery edge part of the opposing substrate 20.

Furthermore, the second surface S2 has the same structure as the display region D1. In addition, the third surface S3 has a structure using a part of a display element of the display region D1 in which a drive circuit etc is formed using the thin film transistor 110. A similar structure as the curved part C between the first surface S1 and second surface S2 exists in the curved part C between the first surface S1 and third surface S3.

[Manufacturing Method of the Display Device 1]

Next, a manufacturing method of the display device 1 described above is explained using FIG. 6 to FIG. 12.

Figure 6:
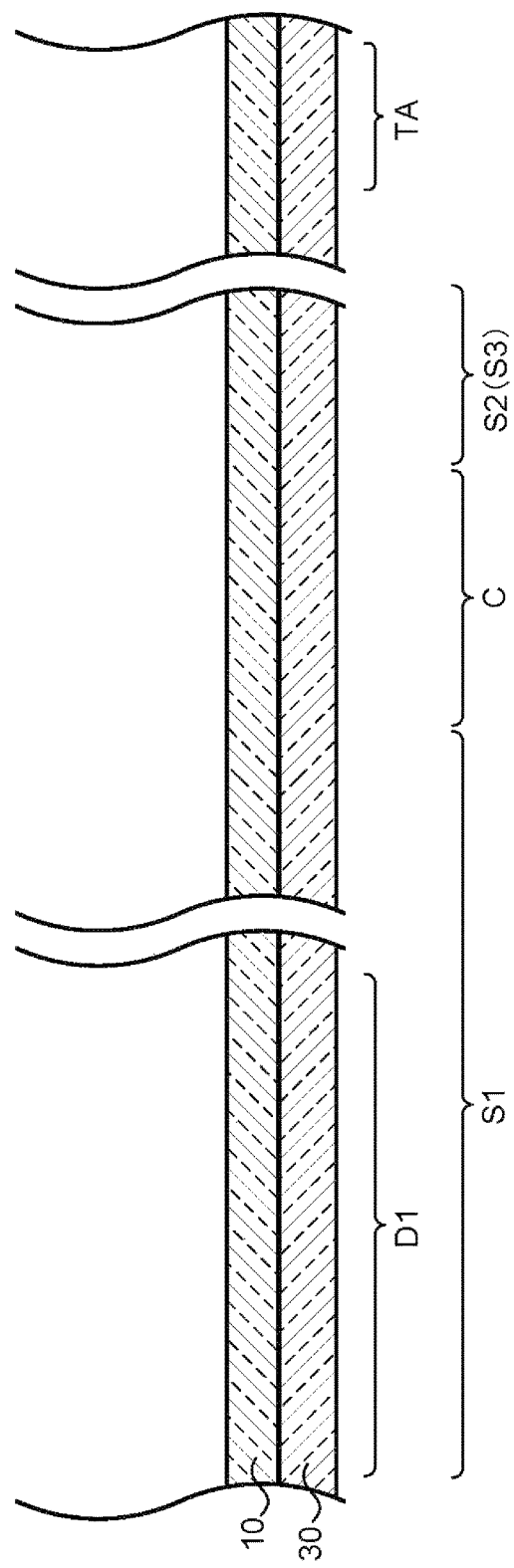
FIG. 6 is a diagram for explaining a process for forming a substrate among the methods of manufacturing a display device in the first embodiment.

FIG. 6 is a diagram for explaining a process for forming a substrate in the manufacturing method of the display device 1 in the first embodiment. The flexible substrate 10 is formed above a glass substrate 30. The flexible substrate 10 is an organic resin layer and in this example is formed from polyimide. For example, the flexible substrate 10 is formed on the glass substrate 30 by coating and baking a solution containing polyimide above the glass substrate 30. The thickness of the flexible substrate 10 is 1 μm or more and 100 μm or less and preferably 5 μm or more and 50 μm or less. Furthermore, the flexible substrate 10 is not limited to polyimide and may be formed from another organic resin layer. However, the flexible substrate 10 is preferred to be formed from a material having a maximum temperature (at least 300° C., preferably 400° C.) heat resistance in a thermal process when forming the thin film transistor 110.

The glass substrate 30 is used as a support substrate for supporting the flexible substrate 10 when forming a display element and the like in the flexible substrate 10. Furthermore, it is not always necessary to use a support substrate.

Figure 7:
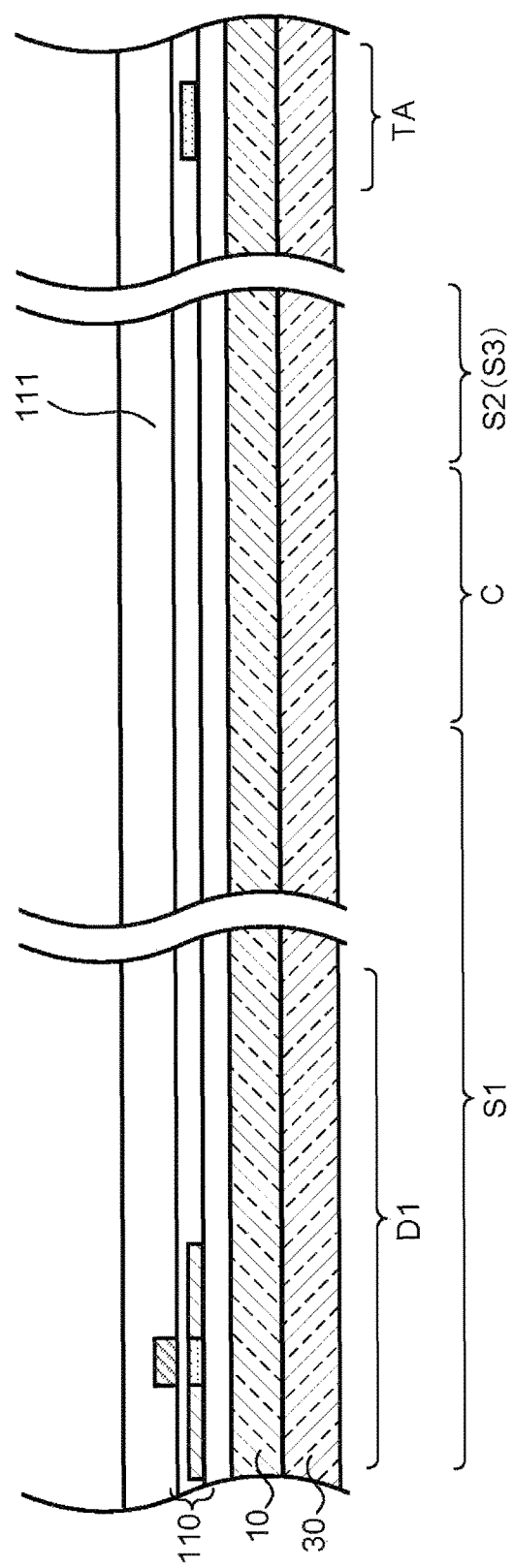
FIG. 7 is a diagram for explaining a process continuing from FIG. 6 among the methods of manufacturing a display device in the first embodiment.

FIG. 7 is a diagram for explaining a process continuing from FIG. 6 in the manufacturing method of the display device in the first embodiment. The thin film transistor 110 is formed in the flexible substrate 10. A silicon oxide or silicon nitride insulation layer is formed between the flexible substrate 10 and thin film transistor 110. The infiltration of moisture or gas to the interior is suppressed by this insulation layer.

Next, the interlayer insulation layer 111 is formed so as to cover the thin film transistor 110. The interlayer insulation layer 111 may be formed by a silicon oxide or silicon nitride insulation layer or an insulation layer using an organic resin.

Figure 8:
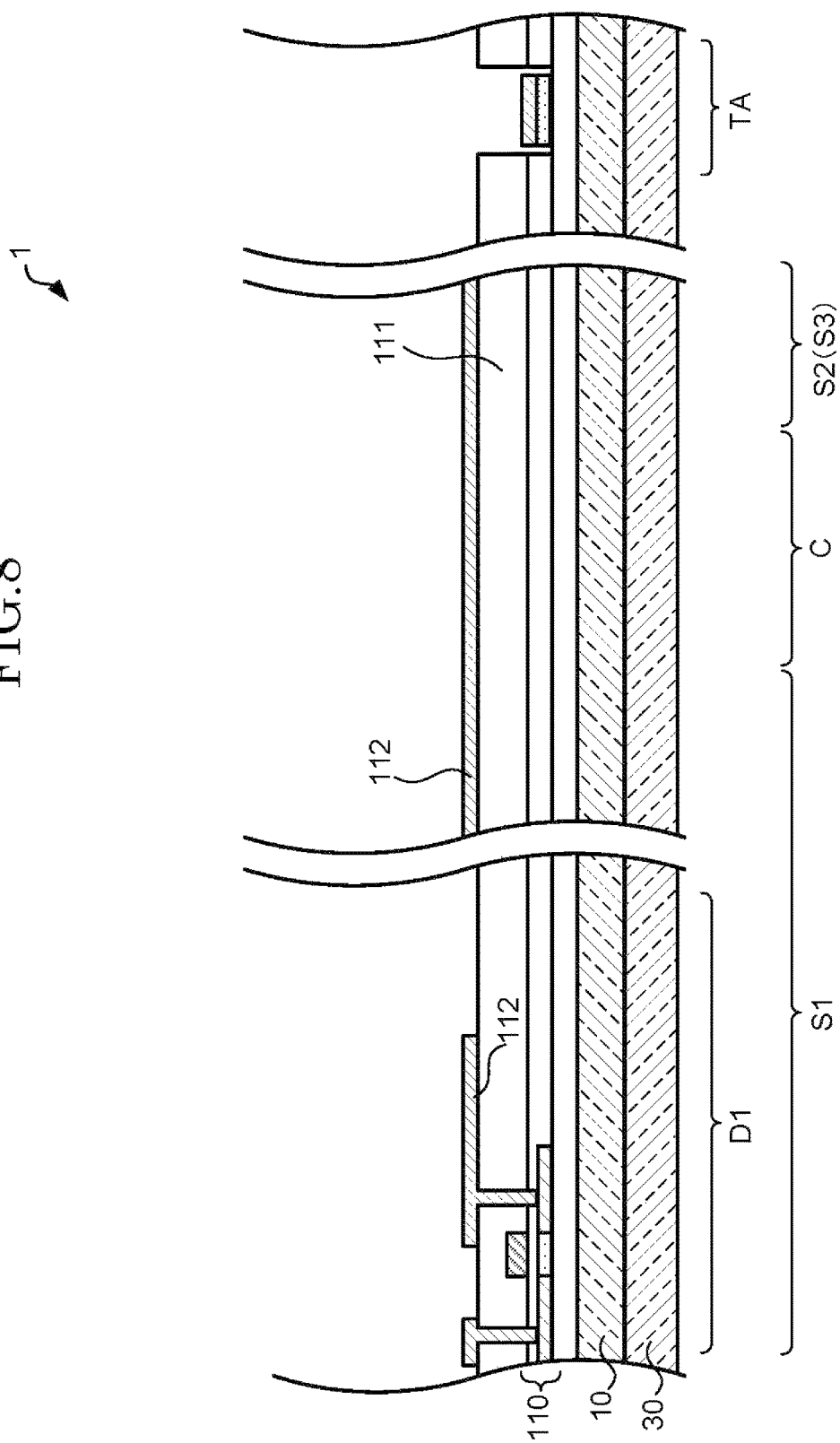
FIG. 8 is a diagram for explaining a process continuing from FIG. 7 among the methods of manufacturing a display device in the first embodiment.

FIG. 8 is a diagram for explaining a process continuing from FIG. 7 in the manufacturing method of the display device in the first embodiment. A part of the interlayer insulation layer 111 formed as described above is etched and a part (source and drain of a semiconductor layer and gate electrode etc) of the thin film transistor 110 is exposed. In addition, the wiring layer 112 is formed into a certain pattern after etching the interlayer insulation layer 111. The wiring layer 112 is a conducting layer such as the scanning line 101 or data signal line 102 described above and is connected with the thin film transistor 110 exposed in a region where the interlayer insulation layer 111 is etched. This conducting layer is formed by stacking a metal such as aluminum or titanium for example.

Figure 9:
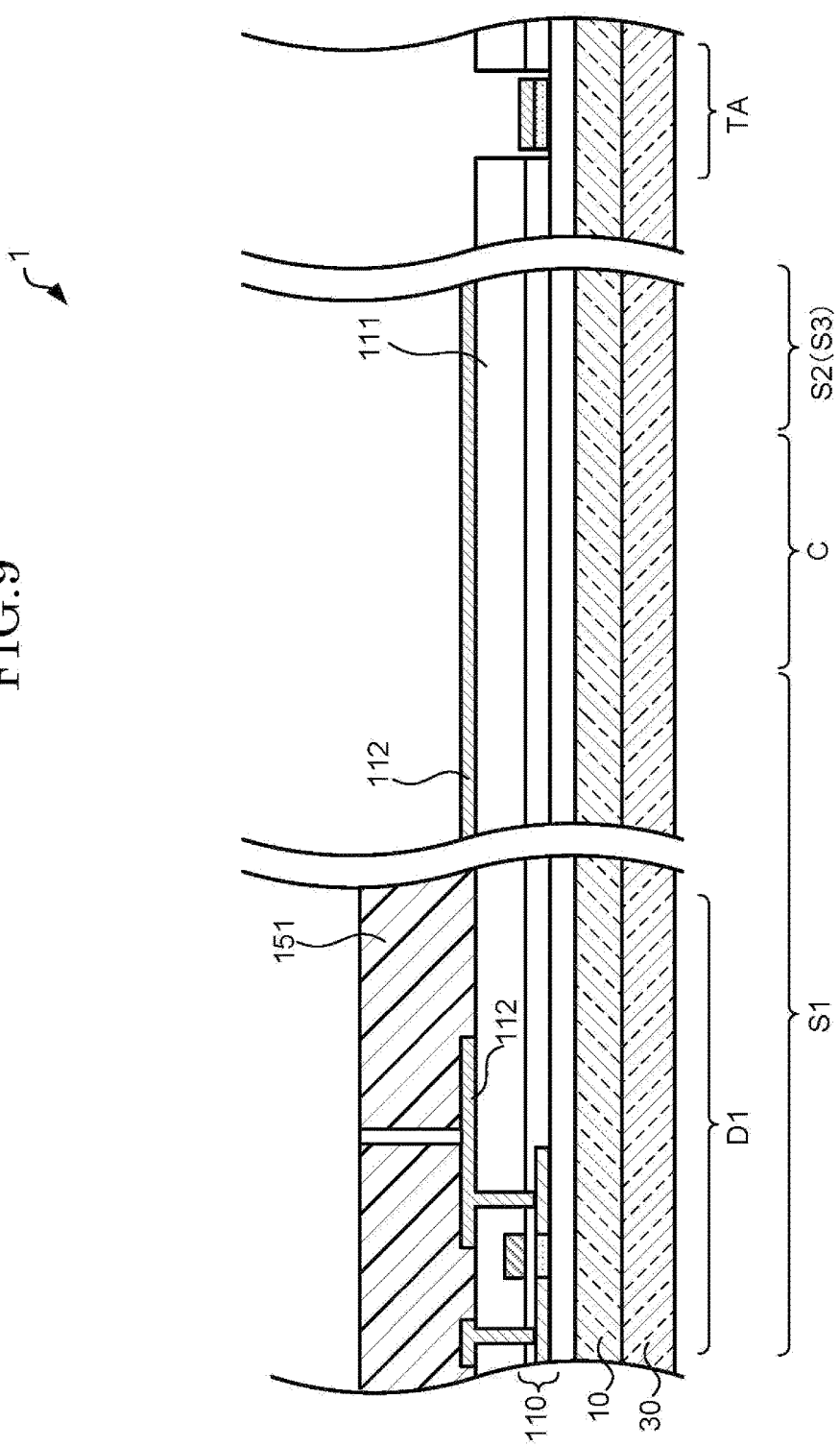
FIG. 9 is a diagram for explaining a process continuing from FIG. 8 among the methods of manufacturing a display device in the first embodiment.

FIG. 9 is a diagram for explaining a process continuing from FIG. 8 in the manufacturing method of the display device in the first embodiment. A part of the wiring layer 112 is exposed and the interlayer organic layer 151 is formed. In this example, the interlayer organic layer 151 is an acrylic resin. The interlayer organic layer 151 is formed by coating a photosensitive acrylic resin on the flexible substrate 10 formed with each structure described above a certain pattern is formed by exposing, developing and baking.

Furthermore, the interlayer organic layer 151 is not limited to acrylic resin and may be formed using another organic resin. However, the interlayer organic layer 151 is preferred to be a material with lower ductility than the flexible substrate 10. As in the embodiments described below, in the case where the interlayer organic layer 151 is used as the protection layer 50, a material with lower ductility than the flexible substrate 10 is used for the interlayer organic layer 151. The thickness of the interlayer organic layer 151 is 0.5 μm or more and 10 μm or less for example, and preferably 1 μm or more and 5 μm or less.

Figure 10:
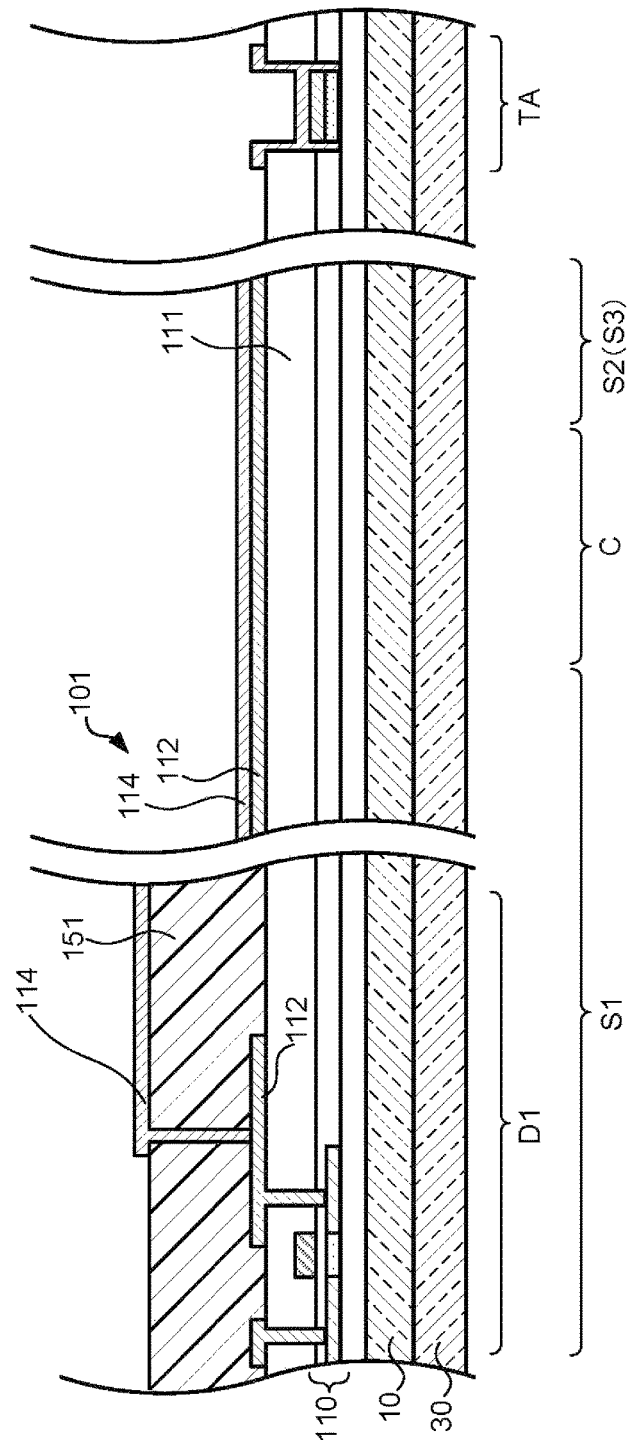
FIG. 10 is a diagram for explaining a process continuing from FIG. 9 among the methods of manufacturing a display device in the first embodiment.

FIG. 10 is a diagram for explaining a process continuing from FIG. 9 in the manufacturing method of the display device in the first embodiment. The pixel electrode layer 114 is formed above the interlayer organic layer 151 formed with the pattern described above. In this example, a metal oxide such as ITO (Indium Tin Oxide) is used for the pixel electrode layer 114 and an anode electrode of the OLED is formed. In addition, in this example, the pixel electrode layer 114 is arranged above the wiring layer 112 in the vicinity of the curved part C to form the scanning line 101 using a stacked structure. Furthermore, the scanning line 101 may be formed in either the wiring layer 112 or pixel electrode layer 114 in the vicinity of the curved part C.

Figure 11:
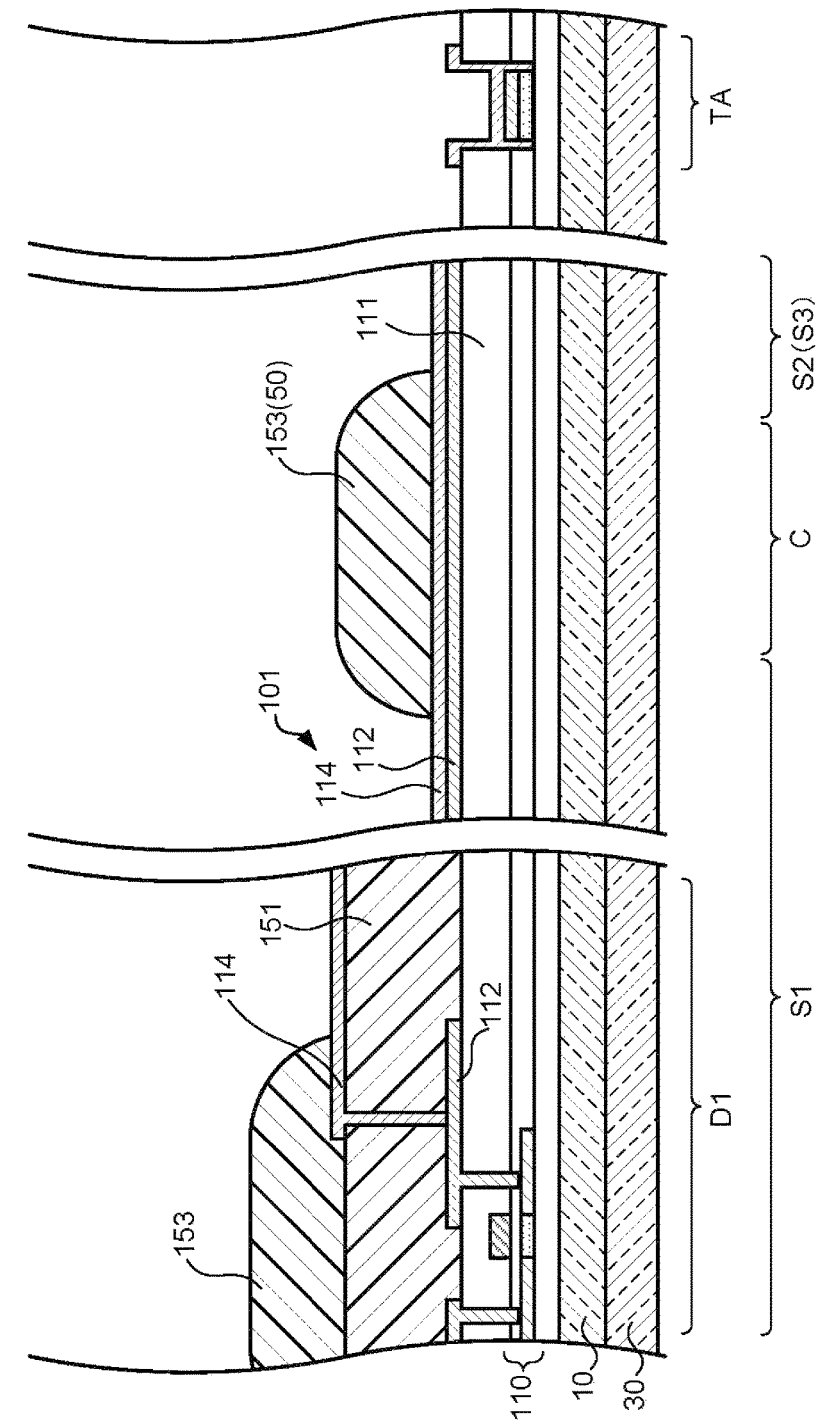
FIG. 11 is a diagram for explaining a process continuing from FIG. 10 among the methods of manufacturing a display device in the first embodiment.

FIG. 11 is a diagram for explaining a process continuing from FIG. 10 in the manufacturing method of the display device in the first embodiment. A part of the pixel electrode layer 114 is exposed and the rib organic layer 153 is formed. In this example the rib organic layer 153 is an acrylic resin. The rib organic layer 153 is formed by coating a photosensitive acrylic resin on the flexible substrate 10 formed with each structure described above and a desired pattern is formed by exposing, developing and baking. Furthermore, the rib organic layer 153 is not limited to an acrylic resin and can be formed from another organic resin. However, the rib organic layer 153 used as the protection layer 50 is required to be a material with lower ductility than the flexible substrate 10. Furthermore, the rib organic layer 153 is not limited to this structure in the case where the rib organic layer 153 is not used as the protection layer 50 as is described in the embodiments below. The thickness of the rib organic layer 153 is 0.5 μm or more and 10 μm or less for example, and preferably 1 μm or more and 5 μm or less.

The rib organic layer 153 is formed so as to cover the periphery edge part of the pixel electrode layer 114 in the display region D1. In addition, the rib organic layer 153 is arranged in the curved part C and across a certain region on both sides of the curved part C in the vicinity of the curved part C and the protection layer 50 described above is formed.

Figure 12:
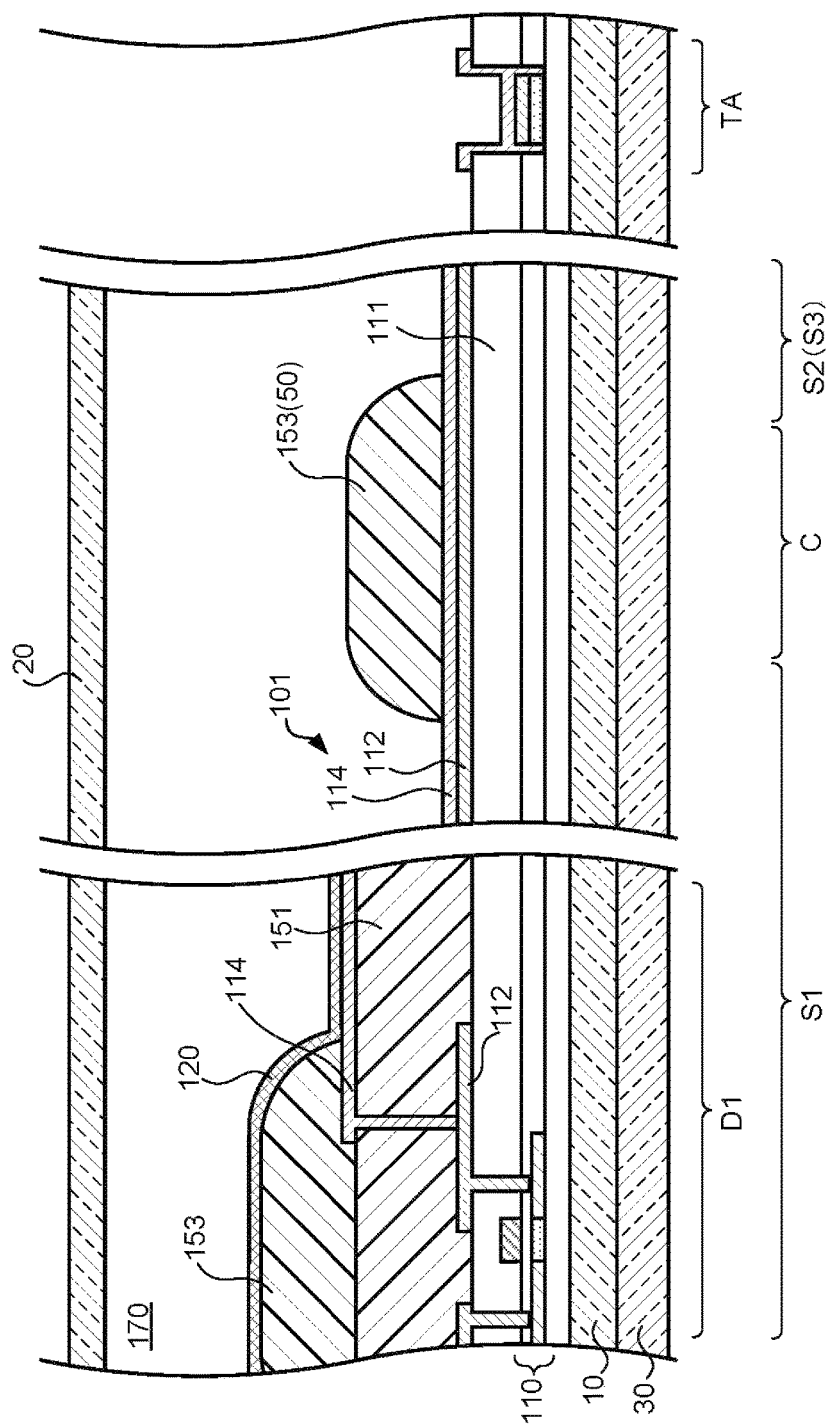
FIG. 12 is a diagram for explaining a process continuing from FIG. 11 among the methods of manufacturing a display device in the first embodiment.

FIG. 12 is a diagram for explaining a process continuing from FIG. 11 in the manufacturing method of the display device in the first embodiment. The light emitting layer 120 is formed after forming the rib organic layer 153. Following this, a display element of at least the display region D1 and D2 is sealed by the opposing substrate 20. An acrylic resin filler 170 is filled between the opposing substrate 20 and flexible substrate 10 when sealing is performed. Furthermore, in this example the vicinity of the curved part C is also sealed by the opposing substrate 20.

The opposing substrate 20 is formed from a material having flexibility such as an organic resin layer the same as the flexible substrate 10. A color filter and light blocking layer and the like may also be formed in the opposing substrate 20.

Following this, light such as a laser is irradiated from the glass substrate 30 side towards to the flexible substrate 10 and the glass substrate 30 is peeled from the flexible substrate 10. When laser light is irradiated from the glass substrate 30 side, the laser light is absorbed by the organic resin layer at the boundary between the flexible substrate 10 and glass substrate 30 and heated. In this way, the organic resin layer breaks up, an adhesive force between the glass substrate 30 and the flexible substrate 10 is weakened and peeling becomes possible. In this way, the display device 1 shown in FIG. 1B and FIG. 5 is manufactured.

In addition, as described above the display device 1 shown in FIG. 1A is completed when the second surface S2 and third surface S3 are cured and fixed with respect to the first surface S1 and baked while in a fixed state. The baking temperature is 60° C. or more and 250° C. or less. In the case where an OLED is used in the display element, it is preferred that the sintering temperature is 60° C. or more and 100° C. or less and more preferably 70° C. or more and 80° C. or less considering the heat resistance of the OLED. Furthermore, in the case where a material with high heat resistance is used in the display element, or in the case when baking described above is performed before forming a material (OLED for example) with low heat resistance included in the display element, the baking temperature is 200° C. or more and 240° C. or less and more preferably 220° C. or more and 230° C. or less.

As described above, when the second surface S2 and third surface S3 are curved with respect to the first surface S1, the scanning line 101 is applied with a force in a pulling direction (direction in which it breaks easily) due to the effects of the thickness of the flexible substrate 10. As in the first embodiment, by providing the protection layer 50 which has lower ductility than the flexible substrate 10 in the curved part C, the protection layer 50 generates a force in the direction in which the flexible substrate 10 is compressed. Therefore, it is possible for the flexible substrate 10 to relieve the force pulling the scanning line 101. In this way, in the case where a curved region is determined in advance, by arranging the protection layer 50 corresponding to a position of a conducting layer such as the scanning line 101, it is possible to improve bending resistance properties of this region.

Second Embodiment

The interlayer organic layer 151 is used as the protection layer 50 in the second embodiment.

Figure 13:
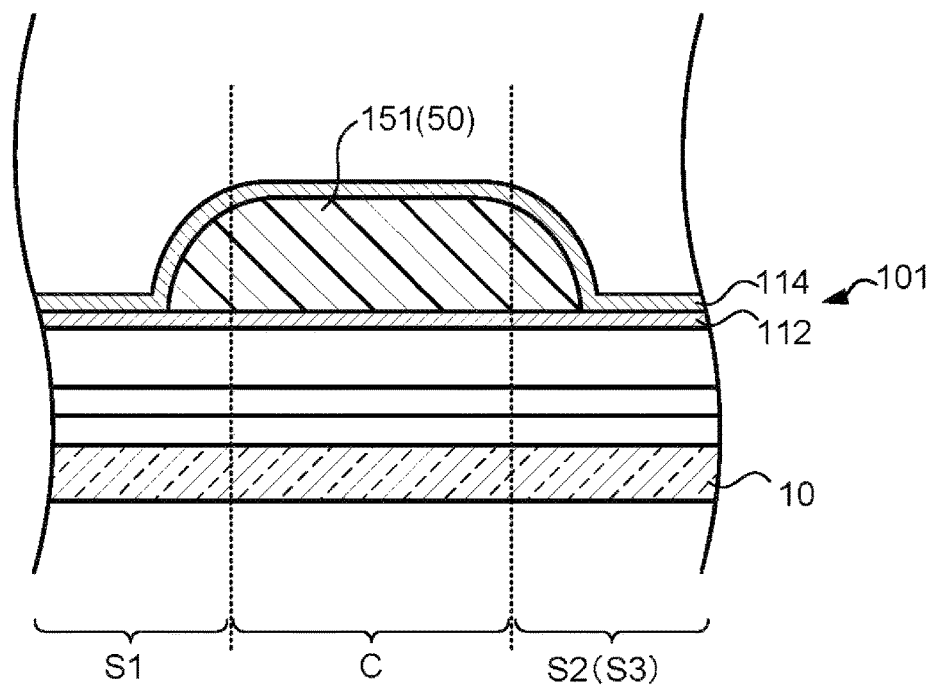
FIG. 13 is a diagram related to a protective layer in a second embodiment and explains a positional relationship with another layer.

FIG. 13 is related to the protection layer 50 in the second embodiment and explains a positional relationship with other layers. As is shown in FIG. 13, the interlayer organic layer 151 is used as the protection layer 50 and the pixel electrode layer 114 is provided (corresponding to FIG. 4) above the protection layer 50. That is, in this example the protection layer 50 is sandwiched between the pixel electrode layer 114 and wiring layer 112.

In this case, the interlayer organic layer 151 is formed with a material having lower ductility than the flexible substrate 10. By adopting this structure, the load on the scanning layer 101 (wiring layer 112 and pixel electrode layer 114) in the curved part C is reduced by providing the protection layer 50 and it is possible to improve bending resistance properties.

Third Embodiment

The interlayer organic layer 151 and rib organic layer 153 are used as the protection layer 50 in the third embodiment.

Figure 14:
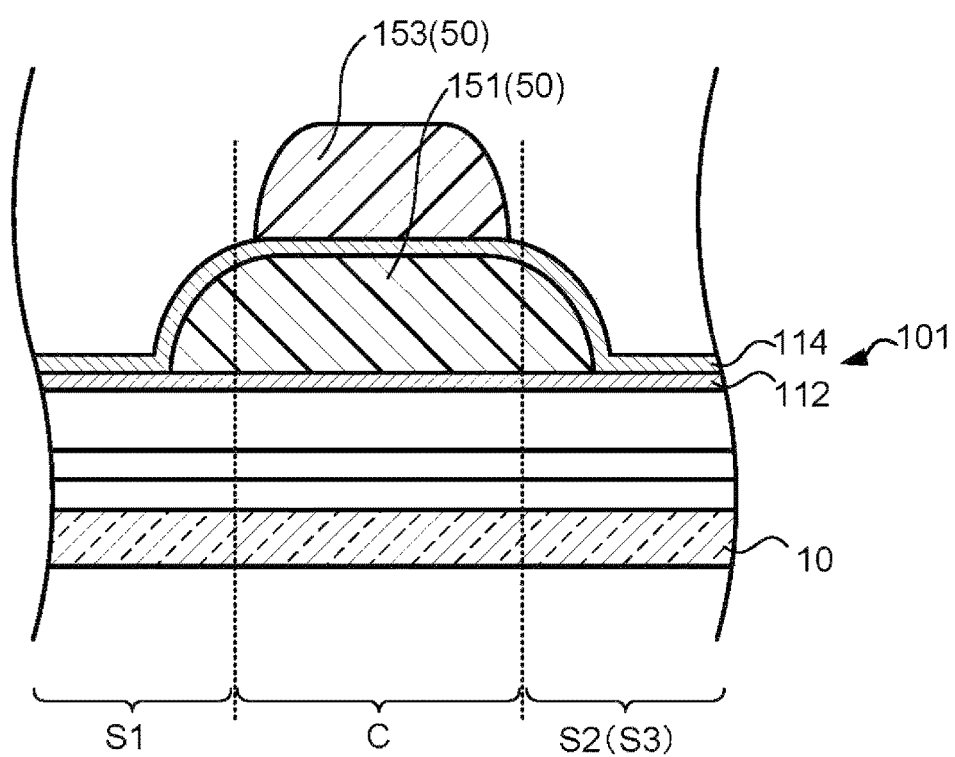
FIG. 14 is a diagram related to a protective layer in third embodiment and explains a positional relationship with another layer.

FIG. 14 is related to the protection layer 50 in the third embodiment and explains a positional relationship with other layers. As is shown in FIG. 14, the interlayer organic layer 151 and rib organic layer 153 are provided in the vicinity of the curved part C and these form the protection layer 50. In this example, the interlayer organic layer 151 is spread wider than the rib organic layer 153. The rib organic layer 153 is provided only in the interior of the curve part C.

In this example, the pixel electrode layer 114 is sandwiched between the interlayer organic layer 151 and the rib organic layer 153. That is, the pixel electrode layer 114 is sandwiched by the protection layer 50.

The interlayer organic layer 151 and rib organic layer 153 are formed with a material having lower ductility than the flexible substrate 10. Furthermore, the rib organic layer 153 may be formed with a material having lower ductility than the interlayer organic layer 151 as well as the flexible substrate 10.

By adopting this structure, the load on the scanning line 101 (wiring layer 112 and pixel electrode layer 114) in the curved part C is reduced by providing the protection layer 50 and it is possible to improve bending resistance properties.

Fourth Embodiment

The size relationship of the interlayer organic layer 151 and rib organic layer 153 in the third embodiment is in a reverse relationship in the fourth embodiment.

Figure 15:
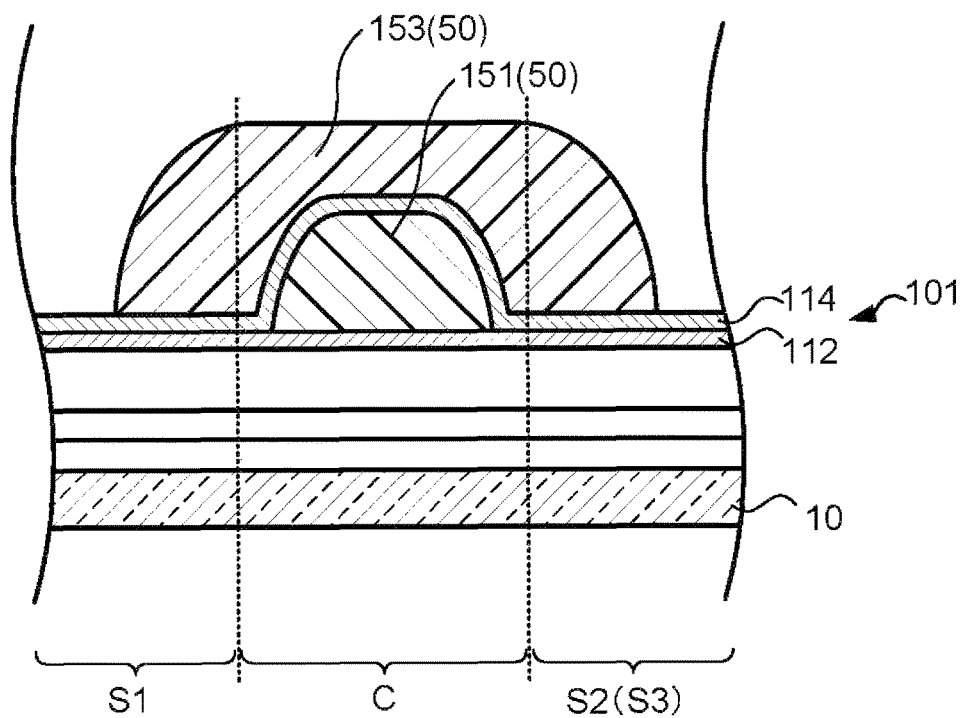
FIG. 15 is a diagram related to a protective layer in a fourth embodiment and explains a positional relationship with another layer.

FIG. 15 is related to the protection layer 50 in the fourth embodiment and explains a positional relationship with other layers. As is shown in FIG. 15, the interlayer organic layer 151 and rib organic layer 153 are provided in the vicinity of the curved part C and these form the protection layer 50. In this example, the rib organic layer 153 is spread wider than the interlayer organic layer 151. The interlayer organic layer 151 is provided only in the interior of the curve part C.

In this example, the pixel electrode layer 114 is sandwiched between the interlayer organic layer 151 and the rib organic layer 153. That is, the pixel electrode layer 114 is sandwiched by the protection layer 50.

The interlayer organic layer 151 and the rib organic layer 153 are each formed with a material having material having lower ductility than the flexible substrate 10. Furthermore, the rib organic layer 153 may be formed with a material having lower ductility than the interlayer organic layer 151 as well as the flexible substrate 10.

By adopting this structure, the load on the scanning line 101 (wiring layer 112 and pixel electrode layer 114) in the curved part C is reduced by providing the protection layer 50 and it is possible to improve bending resistance properties.

Fifth Embodiment

The interlayer organic layer 151 and rib organic layer 153 in the third and fourth embodiments are spread from the curved part C to the first surface S1 side and second surface S2 side respectively in the fifth embodiment.

Figure 16:
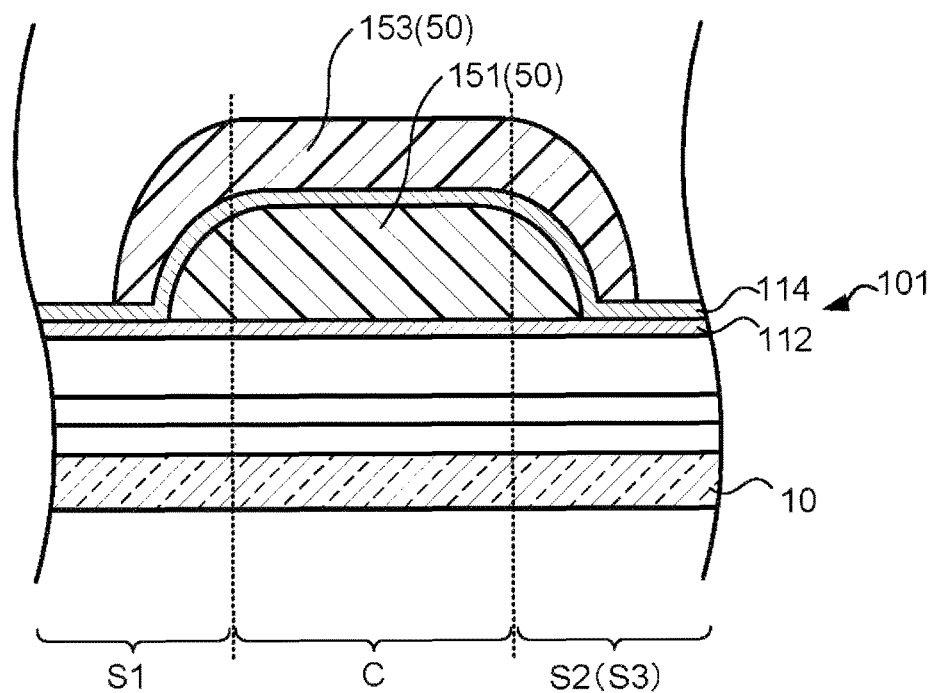
FIG. 16 is a diagram related to a protective layer in a fifth embodiment and explains a positional relationship with another layer.

FIG. 16 is related to the protection layer 50 in the fifth embodiment and explains a positional relationship with other layers. As is shown in FIG. 16, the interlayer organic layer 151 and rib organic layer 153 are provided in the vicinity of the curved part C and these form the protection layer 50. In this example, the rib organic layer 153 is spread wider than the interlayer organic layer 151. Either the interlayer organic layer 151 or the rib organic layer 153 are spread from the curved part C to the first surface S1 side and the second surface S2 side. Furthermore, the size relationship between the interlayer organic layer 151 and rib organic layer 153 may be a reverse relationship.

In this example, the pixel electrode 114 is sandwiched in at least the entire curved part C by the interlayer organic layer 151 and rib organic layer 153. That is, the pixel electrode 114 is sandwiched by the protection layer 50 in at least the entire curved part C.

The interlayer organic layer 151 and the rib organic layer 153 are each formed with a material having material having lower ductility than the flexible substrate 10. Furthermore, the rib organic layer 153 may be formed with a material having lower ductility than the interlayer organic layer 151 as well as the flexible substrate 10.

By adopting this structure, the load on the scanning line 101 (wiring layer 112 and pixel electrode layer 114) in the curved part C is reduced by providing the protection layer 50 and it is possible to improve bending resistance properties. Since the pixel electrode 114 is easier to break in the case where it is formed from a metal oxide rather than a metal layer, it is possible to further improve bending resistance properties by sandwiching the pixel electrode layer 114 between an upper and lower layer using the protection layer 50 in the entire curved part C.

In the category of the concept of the present invention, a person ordinarily skilled in the art could conceive of various modifications and correction examples and could understand that these modifications and correction examples belong to the scope of the present invention. For example, with respect to each embodiment described above, a person ordinarily skilled in the art could appropriately perform an addition or removal of structural components or design modification or an addition of processes or an omission or change in conditions which are included in the scope of the present invention as long as they do not depart from the subject matter of the present invention.

What is claimed is:
1. A display device comprising:
   a substrate including a first surface and a second surface and a curved part between the first surface and the second surface;
   a display element arranged on the first surface;
   a conducting layer connected with the display element and extending to the second surface from the first surface via the curved part;
   a plurality of protective layers having lower ductility than the substrate and arranged in the substrate side and/or opposite side to the substrate side with respect to the conducting layer and along the curved part, each of the plurality of protective layers spreading over the curved part, to a certain region of the first surface side from the curved part, and to a certain region of the second surface side from the curved part.

2. The display device according to claim 1, wherein the certain region of the first surface side is a region different to a region arranged with the display element.

3. The display device according to claim 1, wherein a plurality of conductive layers are arranged in the curved part, and the protective layer arranged corresponding to at least one conducting layer is separated from the protective layer arranged corresponding to the conducting layer adjacent to the conducting layer.

4. The display device according to claim 1, wherein a pattern periphery edge part of the protective layer is formed by a pattern enclosed by a line not having a vertex.

5. The display device according to claim 1, wherein the display element is also arranged in the second surface, and the certain region of the second surface side is a region different to a region arranged with the display element of the second surface.

6. The display device according to claim 1, wherein the conductive layer includes a metal oxide.

7. The display device according to claim 1, wherein the substrate and the protective layer are organic resins.

8. The display device according to claim 1, wherein the substrate is polyimide and the protective layer is acrylic resin.

9. A display device comprising:
   a substrate;
   a display element arranged in the substrate;
   a conducting layer connected with the display element and extending in a certain direction; and
   a plurality of protective layers having lower ductility than the substrate, arranged along a direction different to a direction in which the conductive layer extends and arranged in the substrate side and/or opposite side to the substrate side with respect to the conducting layer.

10. A method of manufacturing a display device comprising:
    forming a display element, conducting layer and a plurality of protective layers in a substrate including a first surface, a second surface and a curved planned region between the first surface and second surface respectively,
    the display element being formed in at least the first surface,
    the conducting layer connecting with the display element and extending to the second surface via the curved planned region from the first surface,
    each of the plurality of protective layers having lower ductility than the substrate, being arranged in a substrate side and/or opposite side to the substrate side with respect to the conducting layer, spreading over the curved planned region, to a certain region of the first surface side from the curved planned region, and to a certain region of the second side from the curved planned region, and each of the plurality of protective layers being arranged along the curved planned region;

curving and fixing the substrate in the curved planned region; and baking the substrate.

11. The method according to claim 10, wherein the certain region of the first surface side is a region different to a region arranged with the display element.

12. The method according to claim 10, wherein a plurality of conductive layers are arranged in the curved planned region, and the protective layer arranged corresponding to at least one conducting layer is separated from the protective layer arranged corresponding to the conducting layer adjacent to the conducting layer.

13. The method according to claim 10, wherein a pattern periphery edge part of the protective layer is formed by a pattern enclosed by a line not having a vertex.

14. The method according to claim 10, wherein the display element is also arranged in the second surface, and the certain region of the second surface side is a region different to a region arranged with the display element of the second surface.

15. The method according to claim 10, wherein the conductive layer includes a metal oxide.

16. The method according to claim 10, wherein the substrate and the protective layer are organic resins.

17. The method according to claim 16, wherein the substrate is polyimide and the protective layer is acrylic resin.

* * * * *